United States Patent
Polisetty et al.

(10) Patent No.: US 8,024,168 B2
(45) Date of Patent: Sep. 20, 2011

(54) DETECTING X STATE TRANSITIONS AND STORING COMPRESSED DEBUG INFORMATION

(75) Inventors: Srinivas Venkata Naga Polisetty, Idupulapadu (IN); Tilman Gloekler, Gaertringen (DE); Claudia Wolkober, Gaeufelden (DE); Ralph C Koester, Tuebingen (DE)

(73) Assignee: International Business Machines Corporation, Armonk, NY (US)

( * ) Notice: Subject to any disclaimer, the term of this patent is extended or adjusted under 35 U.S.C. 154(b) by 567 days.

(21) Appl. No.: 12/138,532

(22) Filed: Jun. 13, 2008

(65) Prior Publication Data

US 2009/0313000 A1    Dec. 17, 2009

(51) Int. Cl.
*G06F 17/50* (2006.01)

(52) U.S. Cl. ............................ 703/14; 716/106

(58) Field of Classification Search .......... 703/14, 703/15, 26, 28, 16; 716/18, 1, 103, 106; 717/14, 131; 712/11; 714/29; 324/762.03; 341/63

See application file for complete search history.

(56) References Cited

U.S. PATENT DOCUMENTS

| | | | | |
|---|---|---|---|---|
| 5,991,533 A * | 11/1999 | Sano et al. | ......... | 703/28 |
| 6,087,967 A * | 7/2000 | Budnik et al. | ......... | 341/63 |
| 6,263,301 B1 * | 7/2001 | Cox et al. | ......... | 703/14 |
| 6,434,517 B1 | 8/2002 | Le | | |
| 6,522,159 B1 * | 2/2003 | Nishide | ......... | 324/762.03 |
| 7,079,997 B1 * | 7/2006 | Hsu et al. | ......... | 703/14 |
| 7,630,876 B1 * | 12/2009 | Bowlby et al. | ......... | 703/14 |
| 2003/0135838 A1 * | 7/2003 | Biswal | ......... | 716/18 |
| 2003/0188299 A1 * | 10/2003 | Broughton et al. | ......... | 717/141 |
| 2003/0208747 A1 * | 11/2003 | Kim et al. | ......... | 717/131 |
| 2005/0091025 A1 * | 4/2005 | Wilson et al. | ......... | 703/16 |
| 2005/0102572 A1 * | 5/2005 | Oberlaender | ......... | 714/29 |
| 2006/0117274 A1 * | 6/2006 | Tseng et al. | ......... | 716/1 |
| 2006/0190239 A1 * | 8/2006 | Piper et al. | ......... | 703/26 |
| 2007/0074000 A1 * | 3/2007 | Colwill et al. | ......... | 712/11 |
| 2007/0174805 A1 * | 7/2007 | Hsu et al. | ......... | 716/18 |
| 2009/0254331 A1 * | 10/2009 | Rabinovitch et al. | ......... | 703/15 |

FOREIGN PATENT DOCUMENTS

WO    0101298 A2    1/2001

OTHER PUBLICATIONS

Gracio et al., "Test preparation and fault analysis using bottom up methodology", IEEE 1989.*
Arai et al., "Analysis of error masking and X masking probabilities for convolutional compactors", IEEE 2005.*
Naruse et al., "On-chip compression of output responses with unknown values using LFSR reseeding", IEEE 2003.*
Chao et al., "A hybrid scheme for compacting test responses with unknown values", IEEE 2007.*
Zeng et al., "Non-intrusive test compression for SOC using embedded FPGA core", IEEE 2004.*

* cited by examiner

*Primary Examiner* — Kandasamy Thangavelu
(74) *Attorney, Agent, or Firm* — Owen J. Gamon

(57) ABSTRACT

A method of generating debug data in a simulation environment includes generating a listing of one or more signals that relate to a failure signal; monitoring simulation data of the one or more signals for transitions between a defined state and an undefined state; and generating a waveform of data based on the transitions between the defined state and the undefined state.

17 Claims, 5 Drawing Sheets

DETECTING X STATE TRANSITIONS AND STORING COMPRESSED DEBUG INFORMATION

BACKGROUND

1. Field

This disclosure relates to methods, systems, and computer program products for debugging in a digital simulation environment.

2. Description of Background

An uninitialized logic or an undefined value at a primary input of a chip design may drive many or all latches of the chip into an undefined state. These problems are found by running multi-valued simulations using a digital simulator. For example, an existing HDL design can be converted into a netlist representation and into a multi-value simulation model. A test case is run using this multi-value simulation model until a checker detects an X state failure. An X state failure is defined as a transition from a defined value to an undefined value in multi-valued simulation. A waveform is generated for all signals in the design for the entire simulation time.

There are many drawbacks to this approach. For example, the approach is time consuming and requires large amounts of storage space. The approach also may need multiple iterations for the following reasons: simulation time increases with model size for creating a waveform of all the signals, since storing the simulation data every cycle becomes a bottleneck and reduces the overall simulation speed; test sequences that run into millions of cycles result in a huge amount of data for the waveform that can not be handled any more by the waveform viewer; and space needed for storing the signal information increases with the number of cycles to run and the model size.

In some cases, simulation may end abruptly with "out of memory" errors. These errors enforce a hard limit on the design size and the number of cycles to record in a waveform and, thus, result in the need for multiple iterations of simulation runs, with each run producing a waveform for a reduced amount of cycles.

SUMMARY

The shortcomings of the prior art are overcome and additional advantages are provided through a method of generating debug data in a simulation environment. The method includes: generating a listing of one or more signals that relate to a failure signal; monitoring simulation data of the one or more signals for transitions between a defined state and an undefined state; and generating a waveform of data based on the transitions between the defined state and the undefined state.

System and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution which reduces the amount of data stored in the waveform, the time to debug failures, the memory usage, as well as the throughput on the computer.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

An exemplary embodiment of the present invention provides methods, systems and computer program products to assist in debugging of X state simulation fails by providing a compressed subset of data in a waveform by a simulator. Generally speaking, the methods, systems, and computer program products of the present invention compress the data stored in the waveform and limit the storage of information to a time interval close to an interesting X state transition.

Figure 1:
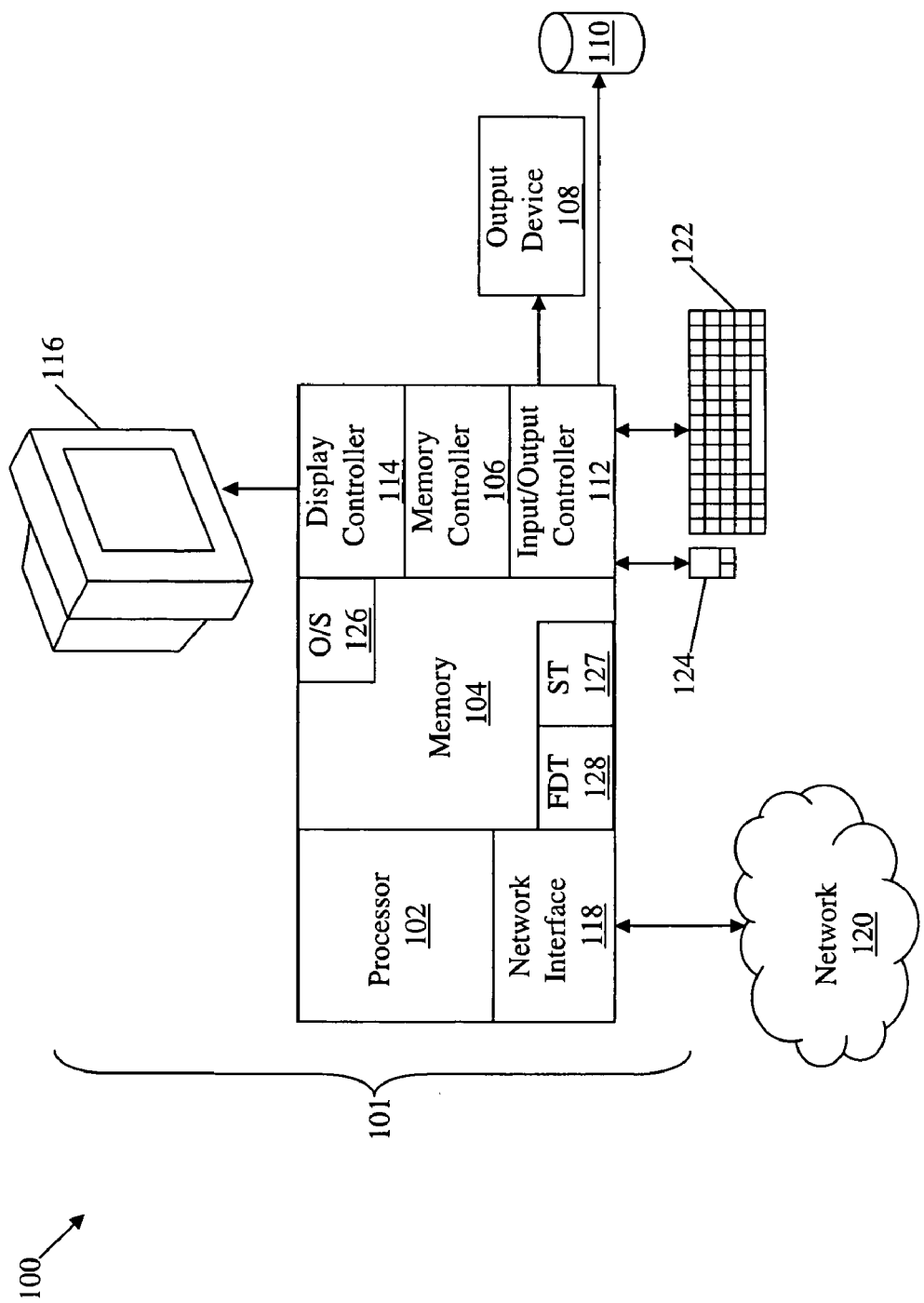
FIG. 1 illustrates one example of a computing system that includes the failure debug system in accordance with an exemplary embodiment.

Turning now to FIG. 1, a block diagram illustrates an exemplary computing system 100 that includes a failure debug system in accordance with the present disclosure. The computing system 100 is shown to include a computer 101. As can be appreciated, the computing system 100 can include any computing device, including but not limited to, a desktop computer, a laptop, a server, a portable handheld device, or any other electronic device. For ease of the discussion, the disclosure will be discussed in the context of the computer 101.

The computer 101 is shown to include a processor 102, memory 104 coupled to a memory controller 106, one or more input and/or output (I/O) devices 108, 110 (or peripherals) that are communicatively coupled via a local input/output controller 112, and a display controller 114 coupled to a display 116. In an exemplary embodiment, the system 100 can further include a network interface 118 for coupling to a network 120. The network 120 transmits and receives data between the computer 101 and external systems. In an exemplary embodiment, a conventional keyboard 122 and mouse 124 can be coupled to the input/output controller 112.

When the computer 101 is in operation, the processor 102 is configured to execute instructions stored within the memory 104, to communicate data to and from the memory 104, and to generally control operations of the computer 101 pursuant to the instructions. The processor 102 can be any custom made or commercially available processor, a central processing unit (CPU), an auxiliary processor among several processors associated with the computer 101, a semiconductor based microprocessor (in the form of a microchip or chip set), a macroprocessor, or generally any device for executing instructions.

In various embodiments, the memory 104 stores the instructions are executed by the processor 102. The instructions stored in memory 104 may include one or more separate programs, each of which comprises an ordered listing of executable instructions for implementing logical functions.

In the example of FIG. 1, the instructions stored in the memory 104 can include a suitable operating system (OS) 126, a simulation tool 127, and a failure debug tool 128. The operating system 126 essentially controls the execution of all user programs and provides scheduling, input-output control, file and data management, memory management, and communication control and related services. The simulation tool 127 develops models and simulates operation of electronic devices (e.g., an integrated circuit). The error debug tool 128 provides simulation data for debugging failures of the simulation. In various embodiments, the error debug tool 128 can be stored in the memory 104 (as shown), can be executed from a portable storage device (e.g., CD-ROM, Diskette, Flash-Drive, etc.) (not shown), and/or can be run from a remote location such as from a central server (not shown)).

Figure 2:
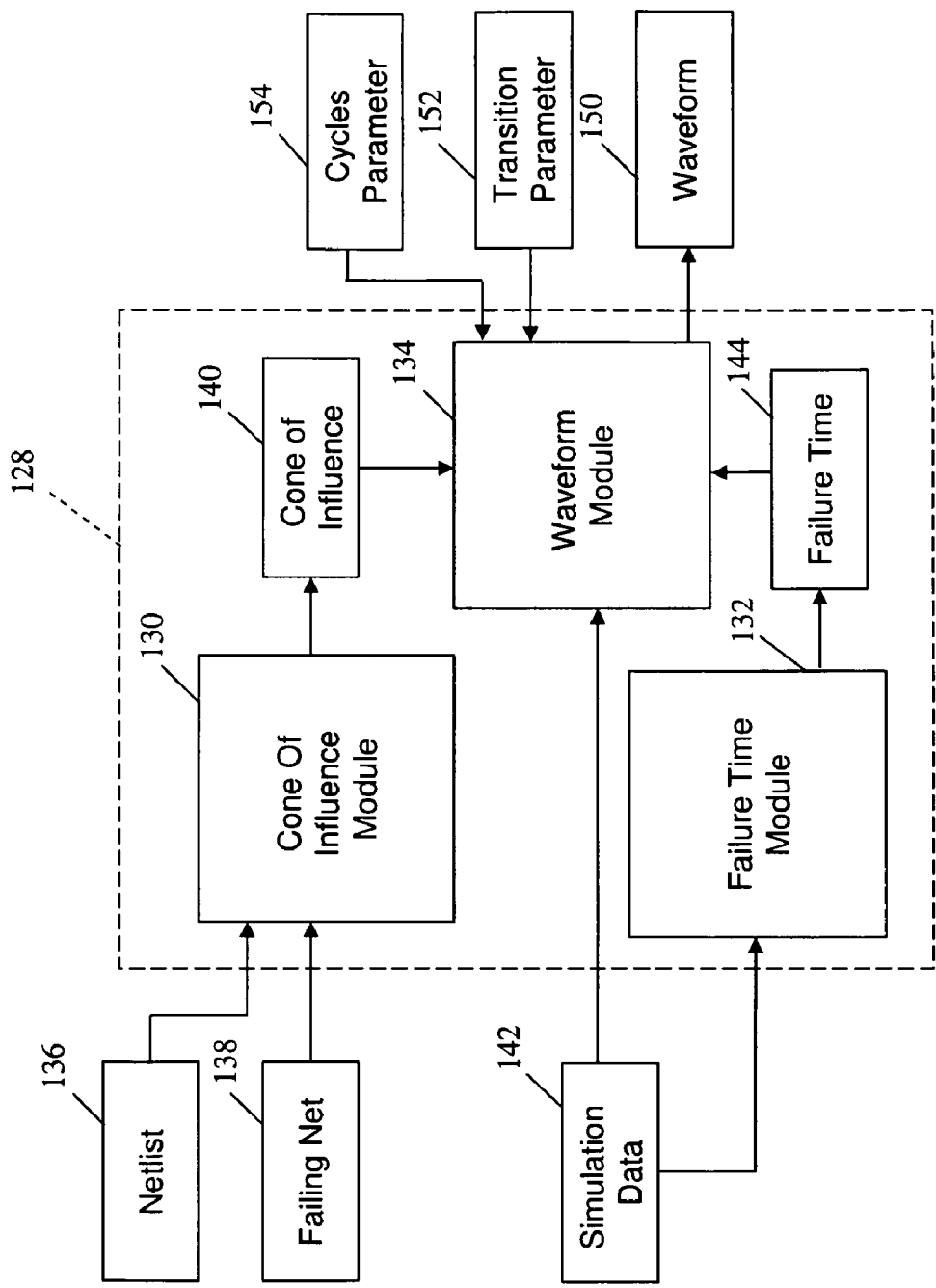
FIG. 2 illustrates one example of the failure debug system in accordance with an exemplary embodiment.

Turning now to FIG. 2, an example embodiment of the error debug tool 128 is shown in accordance with various aspects of the present disclosure. As shown, the error debug tool 128 can include one or more modules. As used herein, the term module refers to an Application Specific Circuit (ASIC), an electronic circuit, a processor (shared, dedicated, or group) and/or memory that executes one or more software or firmware programs, a combinational logic circuit, and/or other suitable components that provide the described functionality. As can be appreciated, the modules shown can be combined and/or further partitioned to similarly detect X state transitions and to store compressed debug information. In this example, the error debug tool 128 includes a cone of influence module 130, a failure time module 132, and a waveform module 134.

The cone of influence module 130 receives as input a netlist 136 and a failing net 138. The netlist 136 includes a listing one or more components and/or signals in the multi-value simulation model. The failing net 138 is an indication of which component or signal has transitioned from a defined value to an undefined value during simulation. These values can be generated by the simulation tool 127 (FIG. 1). Based on the netlist 136 and the failing net 138, the cone of influence module 130 performs a structural analysis of the netlist 136 to obtain a logical cone of influence 140 for the failing net 138. The cone of influence 140 includes a listing of all signals related to the failing net 138. For example, when input signal 1, input signal 2, and input signal 3, all relate to an output signal 4, the cone of influence includes input signal 1, input signal 2, and input signal 3. In one example, the cone of influence module 130 generates the cone of influence 140 by back traversing the netlist 136.

The failure time module 132 receives as input simulation data 142 that can be generated by the simulation tool 127 (FIG. 1). Based on the simulation data 142, the failure time module 132 determines an exact simulation time ($T_{fail}$) 144 in which the failure occurs.

The waveform module 134 receives as input the cone of influence 140, the failure time 144, and the simulation data 142. Based on the inputs 140-144, the waveform module 134 monitors the simulation data 142 and generates a waveform 150 including a subset of the simulation data 142. More particularly, the waveform module 134 monitors the simulation data 142 relating to the signals in the cone of influence 140 for transitions of the signals from a defined state to an undefined state and stores the corresponding data during these transitions. This reduces the required data size to be stored in the waveform 150 as the transitions between the defined state values are replaced with a single value in a relatively small signal list.

Figure 3B:
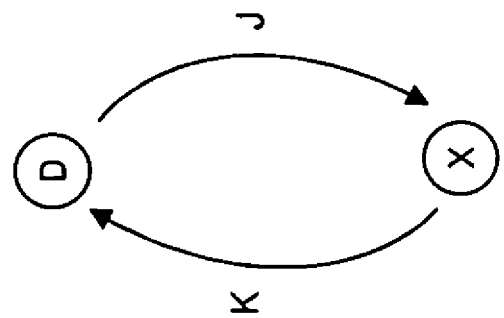
FIGS. 3A and 3B illustrate examples of state transitions that are recognized by the failure debug system in accordance with an exemplary embodiment.
Figure 3A:
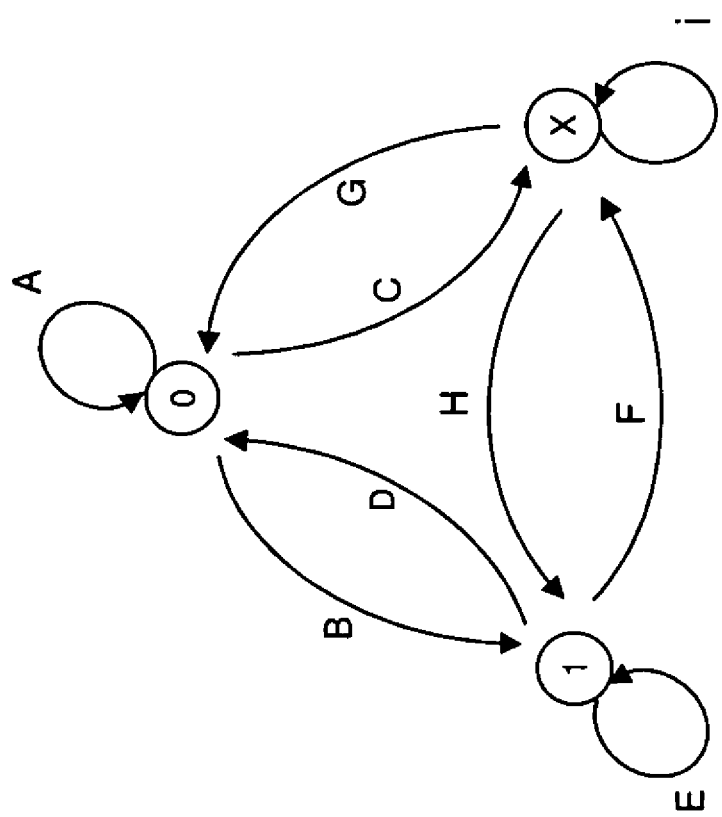

In one example, as shown in FIG. 3A, a signal can have three values {0, 1, X}. The possible transitions A-I are represented by the following array:

$T(n)=\{$"0 to 0," "0 to 1," "0 to X,"
"1 to 0," "to 1," "to X,"
"X to 0," "X to 1," "X to X"$\}$, respectively.

Where, n=0, 1, 2, 3, 4, 5, 6, and 7 (e.g., T(2) denotes the transition from "0 to X" or transition C). The transitions T(2) or C and T(5) or F denote transitions from defined values (O or 1) to undefined values (X), whereas transitions T(6) or G and T(7) or H are transitions from undefined values (X) to defined values (O or 1). These transitions are hereinafter referred to as X state transitions.

As shown in FIG. 3B, the waveform module 134 then maps transitions T(2) or C and T(5) or F to a new transition "D to X" as well as maps transition T(6) or G and T(7) or H to "X to D." Consequently, a new data structure, $NT(n)=\{$"D to X", "X to D"$\}$, is defined that represent transitions J and K, respectively. The waveform module 134 (FIG. 2) then stores the data associated with these newly defined transitions J, K for the respective signal.

With reference back to FIG. 2, in various embodiments, the waveform module 134 can optionally receive as input a transition parameter 152. The transition parameter 152 represents a number (N) of transitions between the defined state and the undefined state. The transition parameter (152) can be selectable. Based on the transition parameter 152, the waveform module 134 stores simulation data until the number (N) of transitions defined by NT(n) occurs, thus, further reducing the amount of data stored in the waveform 150. For typical problems, N can be very small (e.g., ten or less) since X values tend to spread very fast and rarely result in multiple transitions between the defined and the undefined state.

In various embodiments, the waveform module 134 can optionally receive as input a cycles parameter 154. The cycles parameter 154 represents a number (Y) of simulation cycles. The cycles parameter 154 can be selectable. Based on the cycles parameter 154, the waveform module 134 stores simulation data for the number (Y) of simulations cycles. If the failure does not occur within Y cycles, the waveform module 134 discards the oldest simulation data stored in the waveform 150 such that the waveform module 134 always has the last Y cycles at its disposal.

Figure 4:
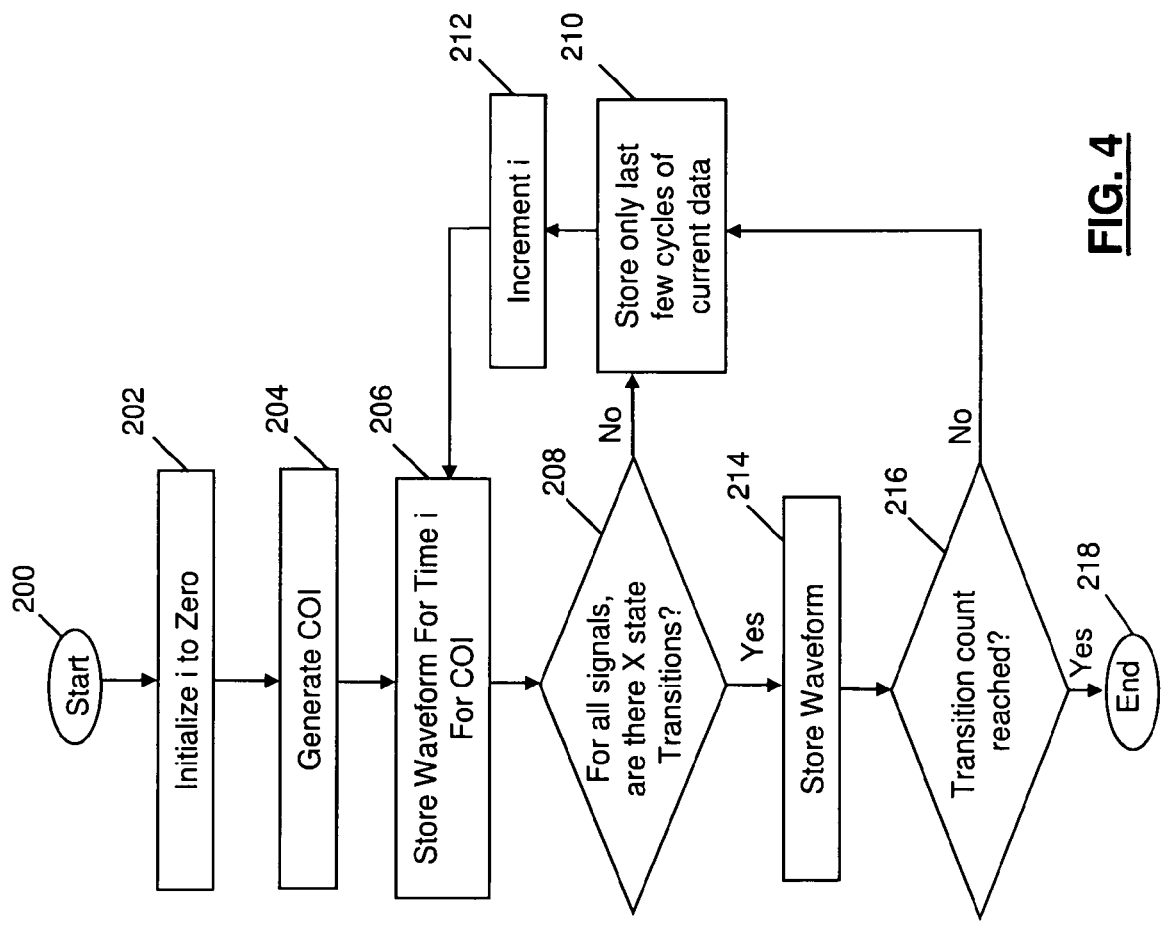
FIG. 4 illustrates one example of a failure debug method that can be performed by the failure debug system in accordance with an exemplary embodiment.

Turning now to FIG. 4, an example of a failure debug method that can be performed by the failure debug system of FIG. 2 is shown in accordance with various aspects of the present disclosure. As can be appreciated in light of the disclosure, the order of operation within the method is not limited to the sequential execution as illustrated in FIG. 4, but may be performed in one or more varying orders as applicable and in accordance with the present disclosure.

In one example, the method may begin at block 200. A timer (i) is initialized to zero at block 202. The cone of influence 140 (FIG. 2) is generated based on the netlist 136 (FIG. 2) at block 204. The simulation data relating to the cone of influence 140 (FIG. 2) at time (i) is monitored at block 206. The X state transitions within the monitored simulation data are evaluated at block 208. For all signals in the cone of influence 140 (FIG. 2), if an X state transition occurs at block 208, then the corresponding data is stored in the waveform 150 (FIG. 2) at block 214. However, if an X state transition has not occurred at block 208, only the last few cycles of current data is stored at block 210 and the timer (i) is incremented at block 212.

Once the data is stored in the waveform 150 (FIG. 2) at block 214, the transition count is evaluated at block 216. If the transition count is less than the transition parameter 152 (FIG. 2) at block 216, the last bit of current data is stored at block 210 and the timer (i) is incremented at block 212. However, if the transition count is greater than the transition parameter 152 (FIG. 2) at block 216, the method may end at 218. In various embodiments, the method can be repeated Y times, based on the cycles parameter 154 (FIG. 2).

Figure 5A:
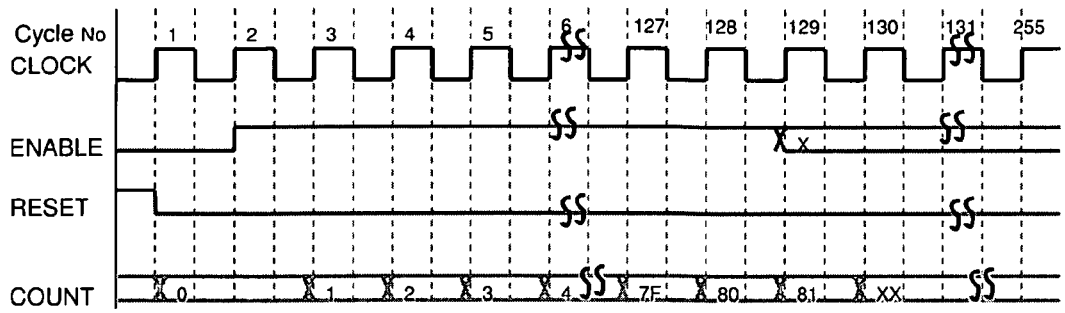
FIGS. 5A, 5B, and 5C illustrate exemplary simulation data for a clock signal that can be stored by the failure debug system in accordance with an exemplary embodiment.
Figure 5B:
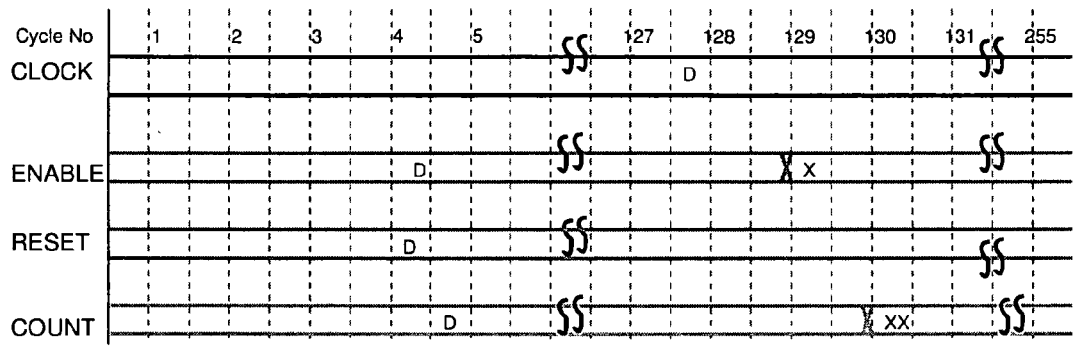
Figure 5C:
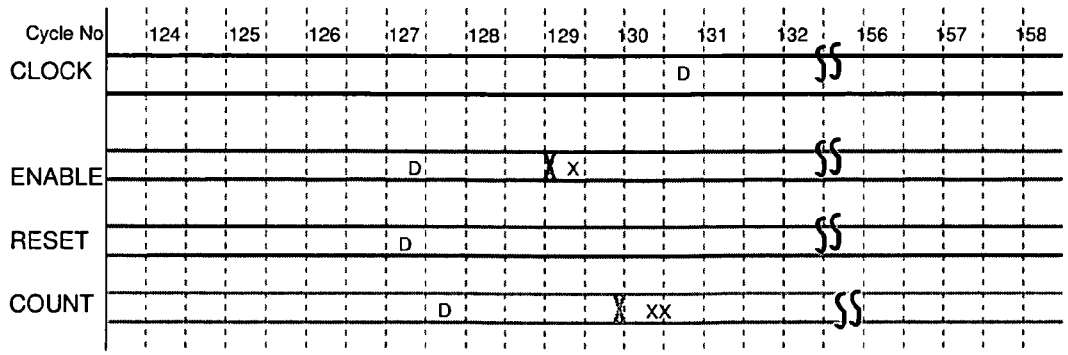

Turning now to FIGS. 5A, 5B, and 5C, an example of simulation data relating to a clock signal of a simulated integrated circuit is shown. The example illustrates a simple eight bit counter with CLOCK, ENABLE and RESET as inputs and COUNT [0:7] as output, where the output COUNT[0:7] is driven to an undefined state at some point during the simulation before the COUNT reaches FF. The failure debug tool 128 (FIG. 1) generates the corresponding waveforms 150 (FIG. 2) for a minimum of 256 cycles needed to reach the count to FF. Memory required to store the waveform 150 (FIG. 2) is proportional to the number of transitions (e.g., Number_of_Trans) on the signals, (Number_of_Trans[CLOCK]=512, and
Number_of_Trans[COUNT]=256).

If COUNT is driven to the undefined state because of ENABLE transitioning to X as shown in FIG. 5A, with Number_of_Trans [CLOCK]=0 and
Number_of_Trans [COUNT]=1, further reduction of data is achieved by limiting the waveform storage to a small interval.

The simulator runs and the failure debug tool 128 (FIG. 1) stores waveform data for 32 cycles (or some memory threshold is reached) and checks for the transition (D to X) on COUNT [0:7]. If the transition is not found, the data of last few cycles (30-32) is saved and the methods of the failure debug tool 128 (FIG. 1) continue for another interval. For a large design, each signal that is of importance and that is driven to an X state can be traced independently, (for limited time interval as discussed above) when the X state transition is detected. Thus, this waveforms point directly to an X state transition for any signal in a simulation, so that all the needed information is generated in one small waveform file for every signal.

As can be appreciated, the capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A computer-implemented method of generating debug data in a simulation environment, the method comprising:
generating, using a computer, a listing of one or more signals that relate to a failure signal;
monitoring, using the computer, simulation data of the one or more signals for transitions between a defined state and an undefined state; and
generating, using the computer, a waveform of data based on the transitions between the defined state and the undefined state, wherein the generating the waveform of the data further comprises generating a compressed subset of the data by replacing transitions between a plurality of defined state values with a single state value.

2. The method of claim 1 further comprising estimating a time of failure for the failure signal and wherein the monitoring comprises monitoring the simulation data during a window of time that is defined based on the time of failure.

3. The method of claim 1 further comprising defining the transitions between the undefined state and the defined state for each signal of the one or more signals based on signal values.

4. The method of claim 1 further comprising defining the transitions between the undefined state and the defined state for the failure signal based on signal values.

5. The method of claim 1 wherein the generating comprises generating the waveform of data based on a transition parameter indicating a number of transitions.

6. The method of claim 1 wherein the generating comprises generating the waveform of data based on a cycles parameter indicating a number of cycles.

7. The method of claim 1 further comprising generating a separate waveform for each of the one or more signals that relate to the failure signal.

8. The method of claim 7 further comprises generating a separate waveform for the failure signal.

9. A failure debugging system, the system comprising:
a processor; and
memory that stores a first module and a second module that execute on the processor, wherein the first module generates a listing of one or more signals that relate to a failure signal and the second module monitors simulation data of the one or more signals for transitions between a defined state and an undefined state and generates a waveform of data based on the transitions and generates a compressed subset of the data in the waveform by replacing transitions between a plurality of defined state values with a single state value.

10. The system of claim 9 further comprising a third module that estimates a time of failure for the failure signal and wherein the second module monitors the simulation data during a window of time that is defined based on the time of failure.

11. The system of claim 9 wherein the second module defines the transitions between the undefined state and the defined state for each signal of the one or more signals based on signal values.

12. The system of claim 9 wherein the second module defines the transitions between the undefined state and the defined state for the failure signal.

13. The system of claim 9 wherein the second module generates the waveform of data based on transition parameter indicating a number of transitions.

14. The system of claim 9 wherein the second module generates the waveform of data based on a cycles parameter indicating a number of cycles.

15. The system of claim 9 wherein the second module generates a separate waveform for each of the one or more signals that relate to the failure signal.

16. The system of claim 15 wherein the second module generates a separate waveform for the failure signal.

17. A computer program product for generating debug data, the computer program product comprising:

a non-transitory computer-readable storage medium that stores instructions for executing debug data generation, the debug data generation comprising a method of:

generating a listing of one or more signals that relate to a failure signal; and monitoring simulation data of the one or more signals for transitions between a defined state and an undefined state; and generating a waveform of data based on the transitions between the defined state and the undefined state, wherein the generating the waveform of the data further comprises generating a compressed subset of the data by replacing transitions between a plurality of defined state values with a single state value.

\* \* \* \* \*